United States Patent
Higashi et al.

(10) Patent No.: US 10,863,657 B2
(45) Date of Patent: Dec. 8, 2020

(54) ELECTRONIC COMPONENT MOUNTING METHOD

(71) Applicant: PANASONIC INTELLECTUAL PROPERTY MANAGEMENT CO., LTD., Osaka (JP)

(72) Inventors: Masayuki Higashi, Yamanashi (JP); Taisuke Mori, Yamanashi (JP); Ryouji Kouchi, Kanagawa (JP); Takuya Yamazaki, Yamanashi (JP); Hisashi Maezono, Yamanashi (JP); Hiroshi Ando, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 549 days.

(21) Appl. No.: 14/768,912

(22) PCT Filed: Feb. 20, 2014

(86) PCT No.: PCT/JP2014/000888
§ 371 (c)(1),
(2) Date: Aug. 19, 2015

(87) PCT Pub. No.: WO2014/129196
PCT Pub. Date: Aug. 28, 2014

(65) Prior Publication Data
US 2016/0007512 A1 Jan. 7, 2016

(30) Foreign Application Priority Data
Feb. 22, 2013 (JP) .................................. 2013-032870

(51) Int. Cl.
*H05K 13/00* (2006.01)
*B65G 15/12* (2006.01)
(Continued)

(52) U.S. Cl.
CPC ......... *H05K 13/0069* (2013.01); *B65G 15/12* (2013.01); *B65G 15/22* (2013.01);
(Continued)

(58) Field of Classification Search
CPC ............... H05K 13/0069; H05K 13/02; H05K 13/0404; H05K 13/0061; H05K 13/08;
(Continued)

(56) References Cited

U.S. PATENT DOCUMENTS 4,342,090 A * 7/1982 Caccoma ................. H01L 21/67
228/180.21
5,317,802 A * 6/1994 Jyoko ............... G05B 19/41805
29/564.1
(Continued)

FOREIGN PATENT DOCUMENTS

| CN | 1430867 A | 7/2003 |
|---|---|---|
| CN | 102469759 A | 5/2012 |

(Continued)

OTHER PUBLICATIONS

International Search Report for Application No. PCT/JP2014/000888 dated Apr. 22, 2014.

*Primary Examiner* — Peter Dungba Vo
*Assistant Examiner* — Jeffrey T Carley
(74) *Attorney, Agent, or Firm* — Pearne & Gordon LLP

(57) ABSTRACT

An electronic component mounting method is performed by an electronic component mounting system including a component mounting line formed by interconnecting component mounting units which concurrently performs component mounting work on two kinds of boards different in mounting workload. The component mounting units includes: first and second board conveyance mechanisms; a component mounting unit; a board distribution unit which receives the board from the upstream-side apparatus and distributes the
(Continued)

received board to either the first board conveyance mechanism or the second board conveyance mechanism; and a distribution control unit which controls the first board conveyance mechanism, the second board conveyance mechanism and the board distribution unit. The electronic component mounting method comprises mixedly distributing the two kinds of the boards to each of the first and second board conveyance mechanisms based on a board request signal issued from a most-upstream component mounting unit in the component mounting line.

4 Claims, 6 Drawing Sheets

(51) Int. Cl.
B65G 15/24 (2006.01)
B65G 15/22 (2006.01)
H05K 13/08 (2006.01)
(52) U.S. Cl.
CPC ......... B65G 15/24 (2013.01); H05K 13/0061 (2013.01); H05K 13/085 (2018.08)
(58) Field of Classification Search
CPC ........ H05K 3/303; B65G 15/12; B65G 15/22; B65G 15/24; Y10T 29/4913; Y10T 29/53174; Y10T 29/53191; Y10T 29/53261
See application file for complete search history.

(56) References Cited

U.S. PATENT DOCUMENTS

| | | | | |
|---|---|---|---|---|
| 5,456,001 A | * | 10/1995 | Mori | H05K 13/021 29/739 |
| 5,513,427 A | * | 5/1996 | Yokoyama | B23P 21/00 29/701 |
| 5,778,524 A | * | 7/1998 | Stridsberg | H05K 13/085 29/836 |
| 5,862,587 A | * | 1/1999 | Higashi | H05K 13/08 29/740 |
| 6,618,935 B1 | * | 9/2003 | Schindler | H05K 13/0452 209/560 |
| 2004/0033128 A1 | * | 2/2004 | Kabeshita | H05K 13/0061 29/740 |
| 2004/0128827 A1 | * | 7/2004 | Shimizu | H05K 13/0061 29/739 |
| 2005/0288806 A1 | * | 12/2005 | Yamazaki | H05K 13/08 700/95 |
| 2006/0000085 A1 | | 1/2006 | Kabeshita et al. | |
| 2011/0017080 A1 | * | 1/2011 | Miyahara | B41F 15/0818 101/123 |
| 2012/0272511 A1 | | 11/2012 | Kawase et al. | |
| 2012/0317803 A1 | | 12/2012 | Kitagawa et al. | |
| 2015/0245493 A1 | * | 8/2015 | Higashi | H05K 13/08 29/836 |
| 2015/0271925 A1 | * | 9/2015 | Mori | H05K 13/0452 29/832 |

FOREIGN PATENT DOCUMENTS

| | | | | |
|---|---|---|---|---|
| CN | 102686096 A | | 9/2012 | |
| JP | 2008-181453 A | | 8/2008 | |
| JP | 2009054620 A | * | 3/2009 | ......... H05K 13/0069 |
| JP | 2009252925 A | * | 10/2009 | |
| JP | 2011-119314 A | | 6/2011 | |
| JP | 2011-119351 A | | 6/2011 | |
| JP | 2012-099654 A | | 5/2012 | |
| JP | 2012-195476 A | | 10/2012 | |
| WO | 2012-098892 A1 | | 7/2012 | |

* cited by examiner

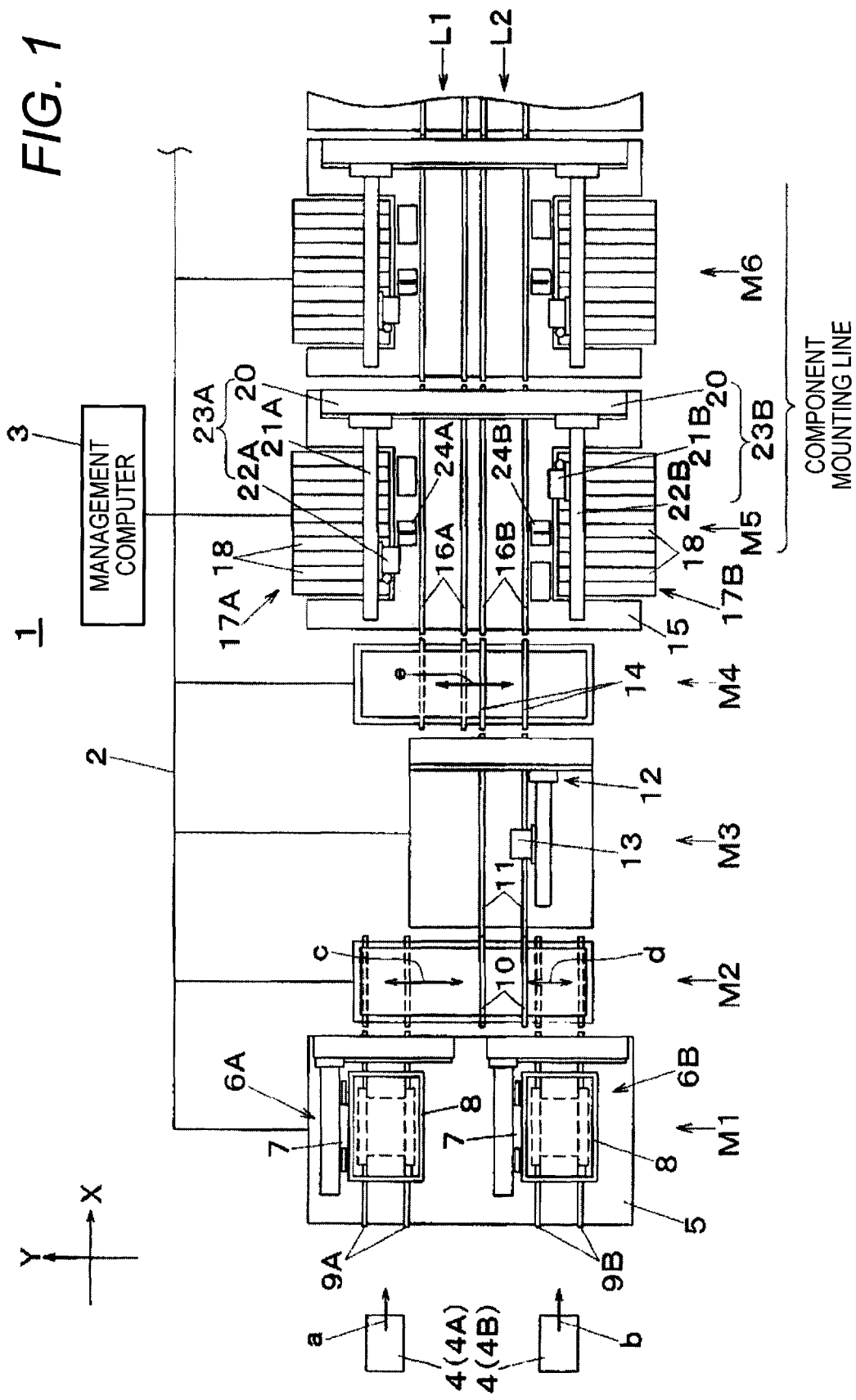

ELECTRONIC COMPONENT MOUNTING METHOD

TECHNICAL FIELD

The present invention relates to an electronic component mounting system and an electronic component mounting method for mounting electronic components on boards to thereby manufacture mounted boards.

BACKGROUND ART

An electronic component mounting system which mounts electronic components on boards to thereby manufacture mounted boards is formed by interconnecting a printing apparatus and a plurality of component mounting apparatuses. The printing apparatus prints paste for solder bonding on the boards. The plurality of component mounting apparatuses execute component mounting work on the printed boards. As such an electronic component mounting system, there has been known an electronic component mounting system which is formed by interconnecting a plurality of lane type component mounting apparatuses provided with a plurality of board conveyance mechanisms which convey boards (see Patent Document 1). With such a configuration, a plurality of boards can be conveyed concurrently by the plurality of lanes so that the efficiency in conveying boards can be improved. Thus, a loss time in which any of the component conveyance mechanisms waits during the board conveyance can be made as short as possible so that the productivity can be improved.

RELATED ART DOCUMENTS

Patent Documents

Patent Document 1: JP-A-2008-181453

SUMMARY OF THE INVENTION

In the electronic industry, production ways have been developed diversely in recent years. Also in a production site for mounting components, there is a demand for a flexible electronic component mounting system in which various mounting work ways can be selected suitably in accordance with characteristics of types of subjects to be produced. However, in the background-art technique described in the above-described Patent Document example, there is the following inconvenience in the case where two kinds of boards different in mounting workload are produced concurrently. That is, the difference in mounting workload leads to a difference in the length of working tact time among the component mounting apparatuses. Accordingly, in the process of executing component mounting work while conveying two kinds of boards different in mounting workload by the board conveyance mechanisms, respectively, a difference in working tact time per board occurs among the board conveyance mechanisms. As a result, a difference in the number of produced boards per unit work hour is generated to make it impossible to keep line balance to thereby cause an inconvenience that the overall production efficiency of the production site is lowered.

An electronic component mounting system including: a component mounting line formed by interconnecting a plurality of component mounting units performing component mounting work to mount an electronic component on a board and which concurrently performs the component mounting work on two kinds of boards different in mounting workload, wherein each of the component mounting units includes: a first board conveyance mechanism and a second board conveyance mechanism, each of which includes a board holding unit which conveys the board delivered from an upstream-side apparatus in a board conveyance direction and positions and holds the conveyed board; component mounting means which executes the component mounting work by picking up the electronic component fed by component feeding means and transfers and mounts the picked-up electronic component onto the board held by the board holding unit; board distribution means which receives the board from the upstream-side apparatus and distributes the received board to either the first board conveyance mechanism or the second board conveyance mechanism; and a distribution control unit which controls the first board conveyance mechanism, the second board conveyance mechanism and the board distribution means, and wherein the distribution control unit mixedly distributes the two kinds of the boards to each of the first board conveyance mechanism and the second board conveyance mechanism based on a board request signal issued from a most-upstream component mounting unit in the component mounting line.

An electronic component mounting method performed by an electronic component mounting system that includes: a component mounting line formed by interconnecting a plurality of component mounting units performing component mounting work to mount an electronic component on a board and which concurrently performs the component mounting work on two kinds of the boards different in mounting workload, wherein each of the component mounting units includes: a first board conveyance mechanism and a second board conveyance mechanism, each of which includes a board holding unit which conveys the board delivered from an upstream-side apparatus in a board conveyance direction and positions and holds the conveyed board; component mounting means which executes the component mounting work by picking up the electronic component fed by component feeding means and transfers and mounts the picked-up electronic component onto the board held by the board holding unit; board distribution means which receives the board from the upstream-side apparatus and distributes the received board to either the first board conveyance mechanism or the second board conveyance mechanism; and a distribution control unit which controls the first board conveyance mechanism, the second board conveyance mechanism and the board distribution means, the electronic component mounting method including: mixedly distributing the two kinds of the boards to each of the first board conveyance mechanism and the second board conveyance mechanism based on a board request signal issued from a most-upstream component mounting unit in the component mounting line.

BRIEF DESCRIPTION OF THE DRAWINGS

FIG. 1 is a view for explaining the configuration of an electronic component mounting system according to an embodiment of the invention.

MODE FOR CARRYING OUT THE INVENTION

Figure 2A:
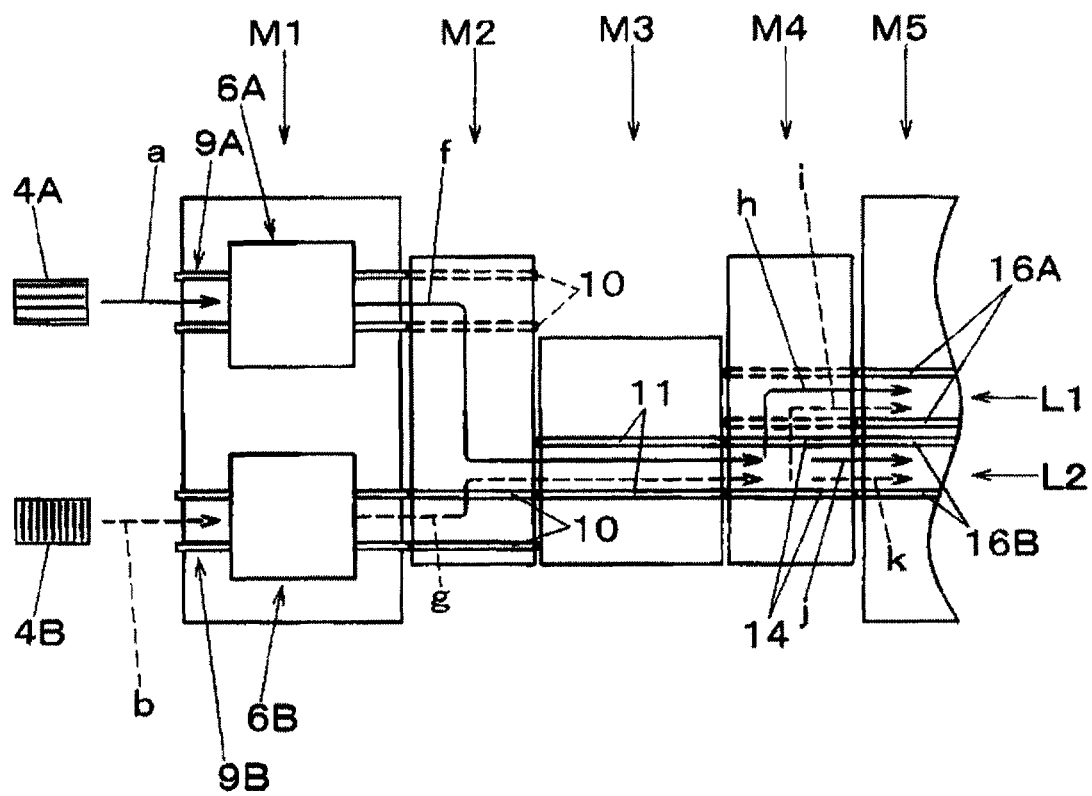
FIGS. 2(a) and 2(b) are views for explaining a board distribution pattern in the electronic component mounting system according to the embodiment of the invention.

First, the configuration of an electronic component mounting system and functions of respective apparatuses will be described with reference to FIG. 1 and FIGS. 2(*a*) and 2(*b*). The electronic component mounting system 1 has a function of manufacturing mounted boards mounted with electronic components. The electronic component mounting system 1 has a configuration in which a component mounting line formed by interconnecting component mounting apparatuses M5, M6, . . . as a plurality of component mounting units is linearly connected in a board conveyance direction (X direction) on a downstream side of a screen printing apparatus M1, a first distribution conveyor M2, a printing inspection apparatus M3 and a second distribution conveyor M4 which are disposed in the named order from an upstream side (left side in FIG. 1). These apparatuses are connected to a management computer 3 through an LAN system 2. The management computer 3 generally controls component mounting work performed by the respective apparatuses of the electronic component mounting system 1.

In the embodiment, the component mounting apparatuses M5, M6, . . . have a first mounting lane L1 and a second mounting lane L2 which are arranged in parallel. By use of the two rows of the mounting lanes, the component mounting apparatuses M5, M6, . . . can perform component mounting work on two kinds of boards 4 (see boards 4A and 4B shown in FIGS. 2(*a*) and 2(*b*)) concurrently. Here, as shown in FIG. 2(*b*), a first face 4*a* and a second face 4*b* forming the front and the back of one and the same board 4 correspond to the two kinds of boards 4A and 4B.

Typically, there is a big difference in component mounting density between the first face 4*a* and the second face 4*b* of the board 4. When these mounting faces are set as work subjects individually, mounting workloads are different between the mounting faces. That is, in the embodiment, two kinds of boards 4 different in mounting workload are produced concurrently. Incidentally, in addition to the case where the front and back faces of one and the same board are subjected to work as the two kinds of boards 4 different in working workload, the embodiment may be applied to the case where the two kinds of boards etc. the same in number are produced concurrently. In this case, the two kinds of boards quite different in board kind itself are paired when they are used in the form of a product.

Recognition marks MA and MB for identification are formed in advance in the first face 4*a* and the second face 4*b* of the board 4. These recognition marks MA and MB are imaged and recognized. In this manner, it is possible to identify whether the mounting face as a work subject corresponds to the board 4A or the board 4B.

These boards 4A and 4B are supplied individually from a board feeding apparatus (not shown) on an upstream side and conveyed into the screen printing apparatus M1. Here, the screen printing apparatus M1 has a configuration in which two screen printing units, i.e. a first screen printing unit 6A and a second screen printing unit 6B are provided on a base 5 and disposed in parallel. The boards 4A and 4B are conveyed into the first screen printing unit 6A and the second screen printing unit 6B through carrying conveyors 9A and 9B respectively (arrows a and b). Squeegee units 7 are slid in a printing direction (Y direction) on screen masks 8 against which the boards 4 are pressed from lower surface sides in the first screen printing unit 6A and the second screen printing unit 6B. Thus, solder paste for bonding electronic components is printed on the boards 4.

Incidentally, although the screen printing apparatus provided with the two screen printing units is used in the embodiment, configuration may be made in such a manner that two screen printing apparatuses each having one screen printing unit are arranged side by side in the conveyance direction.

The printed boards 4 conveyed from the first screen printing unit 6A and the second screen printing unit 6B are delivered to a distribution mechanism 10 of the first distribution conveyor M2 and further conveyed out to the printing inspection apparatus M3 on the downstream side. On this occasion, the distribution mechanism 10 is moved in the Y direction (arrows c and d). Thus, each of the boards 4 can be received selectively from either the first screen printing unit 6A or the second screen printing unit 6B and delivered to an inspection conveyor 11 of the printing inspection apparatus M3.

Figure 2B:
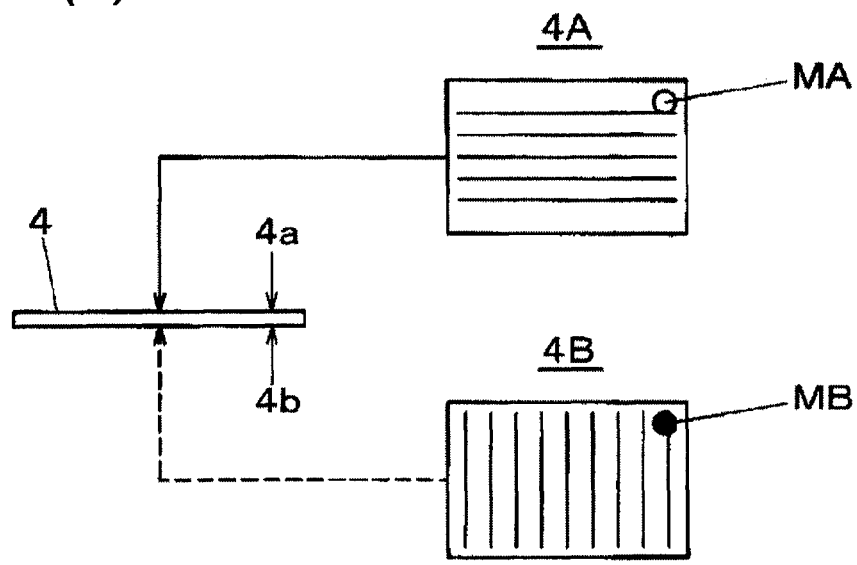

That is, as shown in FIG. 2(*a*), the board 4A conveyed from the first screen printing unit 6A is delivered to the distribution mechanism 10 of the first distribution conveyor M2. Then, the distribution mechanism 10 moves in the Y direction, so that the board 4A can be delivered to the inspection conveyor 11 of the printing inspection apparatus M3 (arrow f). In addition, in the same manner, the board 4B conveyed from the second screen printing unit 6B is also delivered to the distribution mechanism 10 of the first distribution conveyor M2. Then, the distribution mechanism 10 moves in the Y direction, so that the board 4B can be delivered to the inspection conveyor 11 of the printing inspection apparatus M3 (arrow g). The printing inspection apparatus M3 is provided with an inspection head 13 which can be moved desirably in an XY plane by a head movement mechanism 12. The board 4 conveyed by the inspection conveyor 11 is imaged by the inspection head 13 and the imaging result is subjected to recognition processing. In this manner, predetermined printing inspection is executed.

The inspected boards 4 are delivered to the component mounting line through the second distribution conveyor M4 so that component mounting work for mounting electronic components can be performed on the boards 4 by the component mounting apparatuses M5, M6, . . . The component mounting apparatuses M5, M6, . . . have the same configuration. A first board conveyance mechanism 16A and a second board conveyance mechanism 16B forming the first mounting lane L1 and the second mounting lane L2 are provided side by side and arranged in the X direction in the center of a base 15. Due to the first board conveyance mechanism 16A and the second board conveyance mechanism 16B, the boards 4A and 4B delivered from the second distribution conveyor M4 serving as an upstream-side apparatus are conveyed in the board conveyance direction, positioned and held by board holding units (not shown) provided in the first board conveyance mechanism 16A and the second board conveyance mechanism 16B respectively.

For delivering each of the boards 4A and 4B from the second distribution conveyor M4 to the component mounting apparatus M5, a distribution mechanism 14 to which the board 4A or 4B has been delivered from the inspection conveyor 11 is moved in the Y direction (arrow e). In this manner, the board 4A or 4B is selectively conveyed into one of the first board conveyance mechanism 16A and the second board conveyance mechanism 16B. That is, the second distribution conveyor M4 serves as board distribution means which receives the board 4A or 4B from the upstream-side apparatus and distributes the received board 4A or 4B to one of the first board conveyance mechanism 16A and the second board conveyance mechanism 16B.

Figure 3:
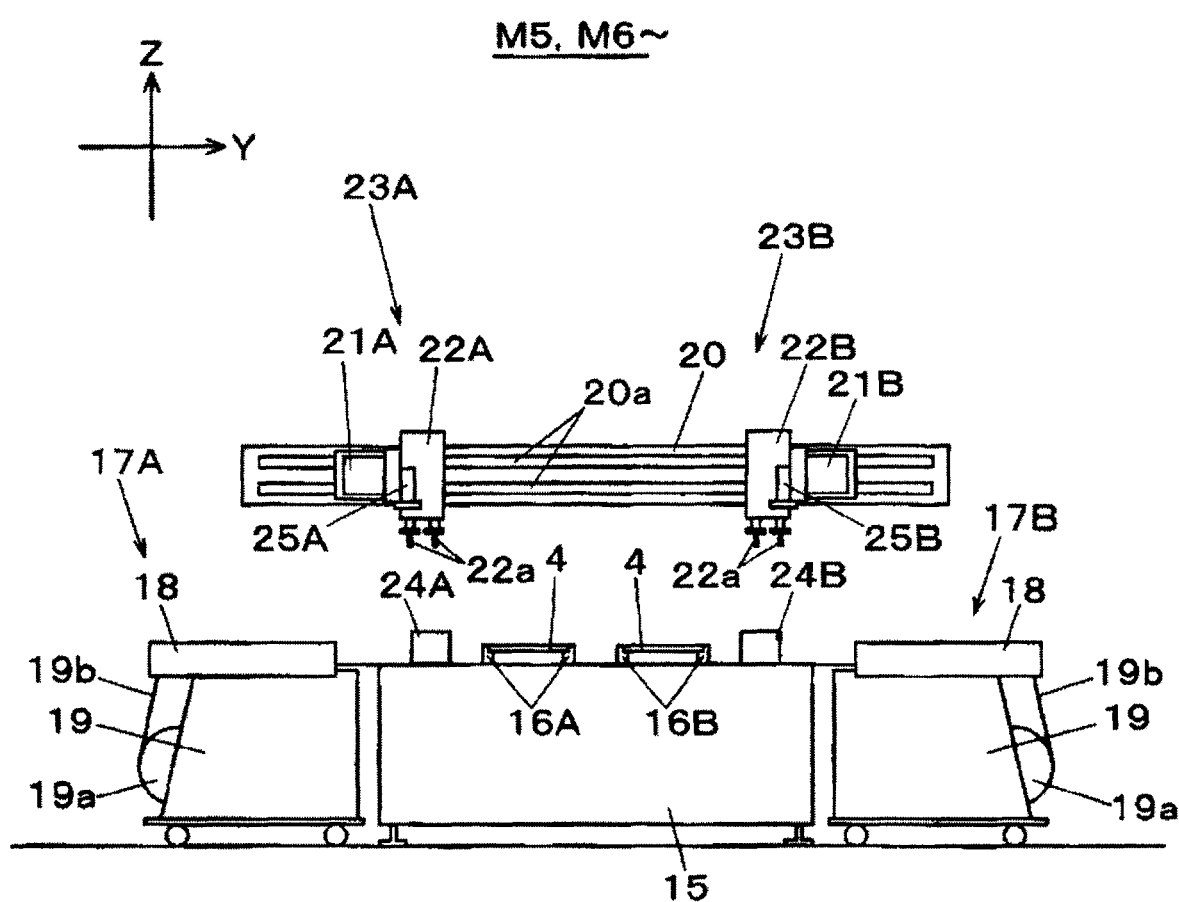
FIG. 3 is a view for explaining the configuration of a component mounting apparatus in the electronic component mounting system according to the embodiment of the invention.

Functions of the component mounting apparatus M5, M6, . . . will be described with reference to FIG. 1 and FIG. 3. The first board conveyance mechanism 16A and the second board conveyance mechanism 16B are provided in the center of an upper surface of the base 15 and arranged in the X direction to convey, position and hold the boards 4A and 4B delivered from the second distribution conveyor M4. A first component feeding unit 17A and a second component feeding unit 17B forming component feeding means are disposed on outer sides of the first board conveyance mechanism 16A and the second board conveyance mechanism 16B respectively. Carts 19 loaded with a plurality of tape feeders 18 are set in the first component feeding unit 17A and the second component feeding unit 17B.

In each of the carts 19, tape feeding reels 19a on which carrier tapes 19b carrying electronic components as subjects to be mounted are wound and received are loaded correspondingly to the respective tape feeders 18. The tape feeders 18 pitch-feed the carrier tapes 19b let out from the tape feeding reels 19a respectively. In this manner, electronic components are fed to positions from which the electronic components can be picked up by component mounting mechanisms which will be described as follows.

A Y-axis movement table 20 is provided in an end portion of the upper surface of the base 15 on the downstream side in the X direction, and arranged in the Y direction. A first X-axis movement table 21A and a second X-axis movement table 21B are attached to the Y-axis movement table 20. The first X-axis movement table 21A and the second X-axis movement table 21B can slide desirably in the Y direction along guide rails 20a disposed in a side surface of the Y-axis movement table 20. The first X-axis movement table 21A and the second X-axis movement table 21B are driven in the Y direction by liner motor mechanisms built in the Y-axis movement table 20.

A first mounting head 22A and a second mounting head 22B are attached to the first X-axis movement table 21A and the second X-axis movement table 21B through X-axis movement attachment bases respectively. The first mounting head 22A and the second mounting head 22B are driven in the X direction by the liner motor mechanisms built in the first X-axis movement table 21A and the second X-axis movement table 21B. The Y-axis movement table 20, and each of the first X-axis movement table 21A and the second X-axis movement table 21B serve as a head movement mechanism for moving corresponding one of the first mounting head 22A and the second mounting head 22B.

Each of the first mounting head 22A and the second mounting head 22B has a configuration in which a plurality of suction nozzles 22a are mounted detachably in its lower portion. The first mounting head 22A or the second mounting head 22B is moved by the head movement mechanism. Electronic components are picked up from tape feeders 18 of the first component feeding unit 17A or the second component feeding unit 17B, transferred and mounted onto the board 4 by the suction nozzles 22a. The first mounting head 22A and the second mounting head 22B and the head movement mechanism serve as component mounting means which executes component mounting work to pick up electronic components fed by the component feeding means and transfer and mount the picked-up electronic components onto the board 4 held by the board holding unit of corresponding one of the first board conveyance mechanism 16A and the second board conveyance mechanism 16B. The component mounting means is formed by a first component mounting mechanism 23A and a second component mounting mechanism 23B which execute component mounting work correspondingly to the first board conveyance mechanism 16A and the second board conveyance mechanism 16B, respectively.

Each of component recognition cameras 24A and 24B is disposed between corresponding one of the first board conveyance mechanism 16A and the second board conveyance mechanism 16B and the tape feeders 18. The component recognition camera 24A or 24B is positioned in a movement path of the first mounting head 22A or the second mounting head 22B to image electronic components carried by the first mounting head 22A or the second mounting head 22B from below. The imaging result is subjected to recognition processing. In this manner, positional displacement of the electronic components carried by the first mounting head 22A or the second mounting head 22B can be detected.

A board recognition camera 25A or 25B moved integrally with the first mounting head 22A or the second mounting head 22B by the head movement mechanism is attached to the first mounting head 22A or the second mounting head 22B. The board recognition camera 25A or 25B moves together with the first mounting head 22A or the second mounting head 22B to above the board 4 held by the first board conveyance mechanism 16A or the second board conveyance mechanism 16B, and images the board 4. The imaging result is subjected to recognition processing. Consequently, the position of the board 4 can be detected and a recognition mark MA or MB formed in the board 4A or 4B of the board 4 can be recognized. In this manner, the board 4 conveyed into the first board conveyance mechanism 16A or the second board conveyance mechanism 16B is identified as the board 4A or the board 4B. Based on the identification result, component mounting work corresponding to the board 4A or 4B is executed. The board 4 which have been subjected to the component mounting work are sent sequentially to a not-shown mounting inspection apparatus and a not-shown reflow apparatus, in which the mounting states are inspected and the electronic components are bonded to the inspected boards by solder.

Figure 4:
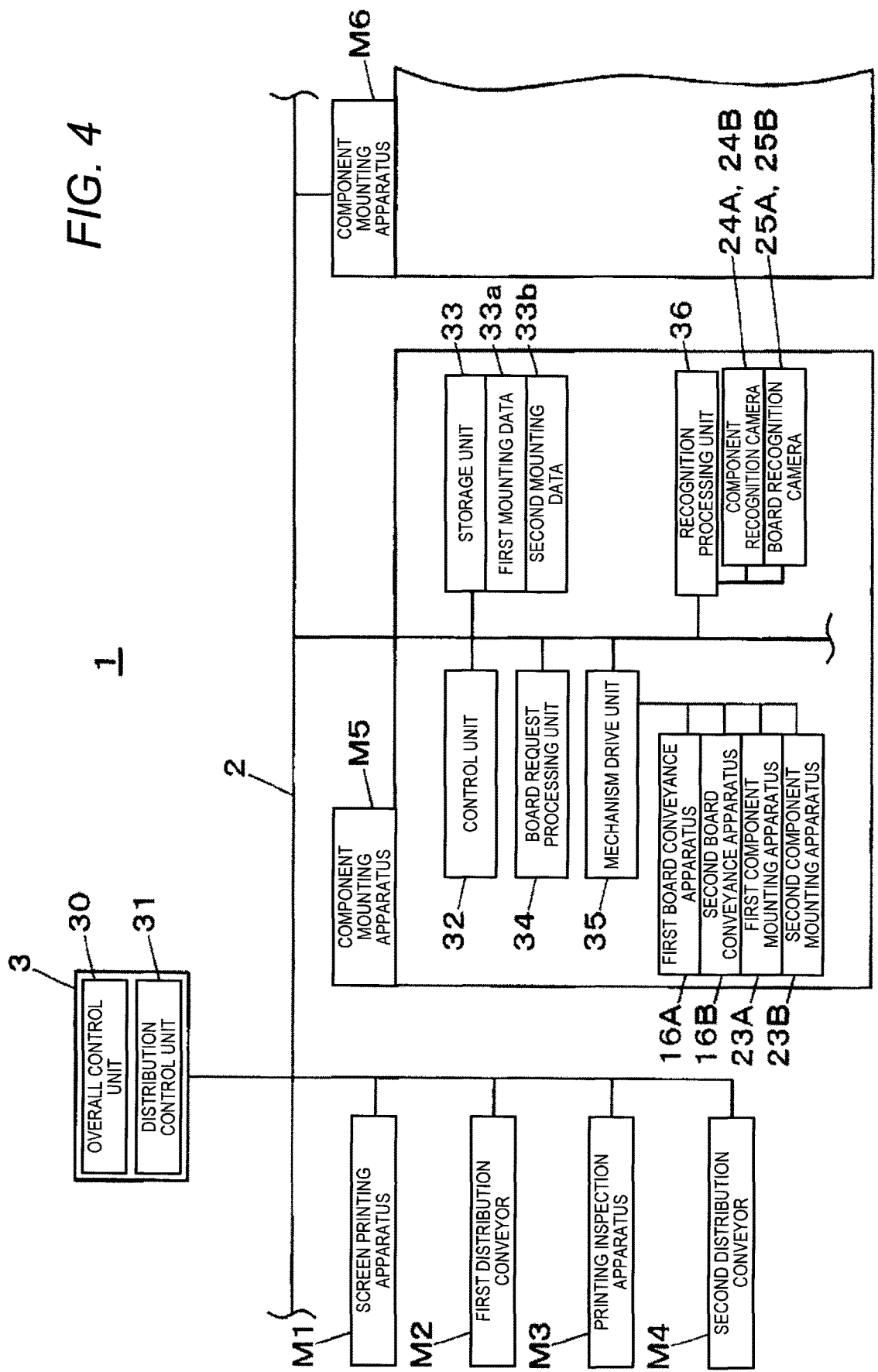
FIG. 4 is a block diagram showing the configuration of a control system in the electronic component mounting system according to the embodiment of the invention.

Next, the configuration of a control system of the electronic component mounting system 1 will be described with reference to FIG. 4. Here, only factors relevant to distribution processing when each board is delivered from the second distribution conveyor M4 to the component mounting apparatus M5 will be described. In FIG. 4, the management computer 3 is connected to the screen printing apparatus M1, the first distribution conveyor M2, the printing inspection apparatus M3, the second distribution conveyor M4, and the component mounting apparatuses M5, M6, . . . through the LAN system 2. The management computer 3 uses an overall control unit 30 to manage entire work of each of the above-described apparatuses, and uses a distribution control unit 31 to control a board distribution operation when the board 4 is delivered from the second distribution conveyor M4 to the component mounting apparatus M5.

That is, the distribution control unit 31 controls the first board conveyance mechanism 16A and the second board conveyance mechanism 16B of the component mounting apparatus M5 disposed as a most-upstream component mounting apparatus in the component mounting line, and the second distribution conveyor M4. In the embodiment, the two kinds of boards 4A and 4B are mixedly distributed to each of the first board conveyance mechanism 16A and the second board conveyance mechanism 16B based on a board request signal issued from the component mounting apparatus M5.

A control system of the component mounting apparatus M5 will be described. The component mounting apparatus M5 is provided with a control unit 32, a storage unit 33, a board request processing unit 34, a mechanism drive unit 35, and a recognition processing unit 36. The control unit 32 is an arithmetic processing unit which controls the following units based on various programs or data stored in the storage unit 33. First mounting data 33a used when the board 4A is set as the subject to be produced and second mounting data 33b used when the board 4B is set as the subject to be produced are included in the various programs or data stored in the storage unit 33.

When either the first mounting lane L1 or the second mounting lane L2 showing a status capable of receiving a board has no board to be subjected to the work, the board request processing unit 34 performs processing to issue a board request signal indicating the fact that there is no board to be subjected to the work in the mounting lane. Based on the board request signal, the distribution control unit 31 performs distribution processing on the board 4 to convey the board 4 to the mounting lane. The mechanism drive unit 35 is controlled by the control unit 32 to drive the first board conveyance mechanism 16A, the second board conveyance mechanism 16B, the first component mounting mechanism 23A and the second component mounting mechanism 23B.

The recognition processing unit 36 performs recognition processing on the imaging result of the component recognition camera 24A or 24B to identify electronic components carried by the first mounting head 22A or the second mounding head 22B or detect positions of the electronic components. Further, the recognition processing unit 36 performs recognition processing on the imaging result of the board recognition camera 25A or 25B to detect the position of the board 4A or 4B and recognize the recognition mark MA or MB so as to identify the work subject as the boards 4A or 4B. Accordingly, the board recognition camera 25A or 25B and the recognition processing unit 36 serves as a board kind identification unit which recognizes the recognition mark MA or MB formed in each of the two kinds of boards (boards 4A and 4B corresponding to the first face 4a and the second face 4b of the board 4 in this case) to identify the kind of the board 4.

When the control unit 32 serving as a mounting control unit controls the mechanism drive unit 35 to drive the first component mounting mechanism 23A or the second component mounting mechanism 23B, the first mounting data 33a and the second mounting data 33b are changed over from one to the other based on the identification result concluded by the board kind identification unit so that the first component mounting mechanism 23A or the second component mounting mechanism 23B serving as component mounting means can be controlled. Further, the identification result of the board kind identified by the component mounting apparatus M5 disposed as a most-upstream component mounting apparatus in the component mounting line is data-shifted to downstream one of the component mounting apparatuses M6, . . . through the LAN system 2 in accordance with conveyance of the board 4 in the component mounting line. In the same manner, in each of the apparatuses, the mounting data are changed over from one to the other in accordance with the identification result of the board kind so that component mounting work can be performed.

Here, a component mounting method applied to each of the component mounting apparatuses M5, M6, . . . each having the above-described configuration will be described. A specification operation example of the electronic component mounting system in the embodiment will be described below with reference to FIG. 5 and FIG. 6.

Here, the component mounting apparatus M5 uses a so-called independent mounting method to only use the first mounting head 22A or the second mounting head 22B to perform component mounting operation on the board 4 (board 4A or 4B) conveyed by the first board conveyance mechanism 16A or the second board conveyance mechanism 16B correspondingly. That is, the first mounting head 22A picks up electronic components from the first component feeding unit 17A and mounts the electronic components on the board 4 positioned by the first board conveyance mechanism 16A, and the second mounting head 22B picks up components from the second component feeding unit 17B and mounts the electronic components on the board 4 positioned by the second board conveyance mechanism 16B. The component mounting apparatuses M6 to M9 in a subsequent stage to the component mounting apparatus M5 also mount electronic components on the board 4 by an independent mounting method in the same manner as the component mounting apparatus M5.

Incidentally, mounting methods in the apparatus configuration having two board conveyance mechanisms and two mounting heads corresponding thereto as in the embodiment include the independent mounting method and a so-called alternate mounting method in which the two mounting heads are used to simultaneously mount components on boards conveyed alternately by the board conveyance mechanisms. Here, when components are mounted on two kinds of boards largely different in mounting workload, use of the independent mounting method as in the embodiment is more efficient in terms of working tact for the following reasons.

In the case of the alternate mounting method, the two mounting heads simultaneously mount components on boards which have been conveyed by one board conveyance mechanism, and the boards on which the electronic components have been mounted are conveyed out to a subsequent stage. While the boards are conveyed out to the subsequent stage, new boards are conveyed in by the other board conveyance mechanism from the component mounting apparatus in the previous stage, and electronic components are mounted on the conveyed new boards simultaneously by the two mounting heads. However, when the mounting workloads of the two kinds of boards (boards 4A and 4B) serving as mounting subjects are different largely, there is a possibility that the above-described timing when the boards are conveyed out to the subsequent stage and the above-described timing when the boards are conveyed in from the previous stage may deviate from each other largely so that a component mounting apparatus which does not have any board as a subject to be mounted with electronic components may be left as it is for a long time. On the other hand, in the case of the independent mounting method, each board conveyance mechanism always has either the board 4A or the board 4B to be mounted by corresponding one of the mounting heads. Accordingly, the above-described deviation between conveyance timings hardly occurs.

However, assume that boards 4A and 4B different in mounting workload are distributed and conveyed fixedly to the mounting lanes L1 and L2 respectively (for example, the board 4A is always distributed to the mounting lane L1 and the board 4B is always distributed to the mounting lane L2). In this case, even in the independent mounting method, one mounting lane to which the board 4 small in mounting workload is distributed completes board production earlier and stays idle unless board production in the other mounting lane is completed. On the other hand, in the electronic component mounting system 1 according to the embodiment, the two kinds of board are distributed mixedly and alternately as will be described as follows. In this manner, it is possible to eliminate the above-described unevenness in working tact time between the mounting lanes in the independent mounting method.

Figure 5:
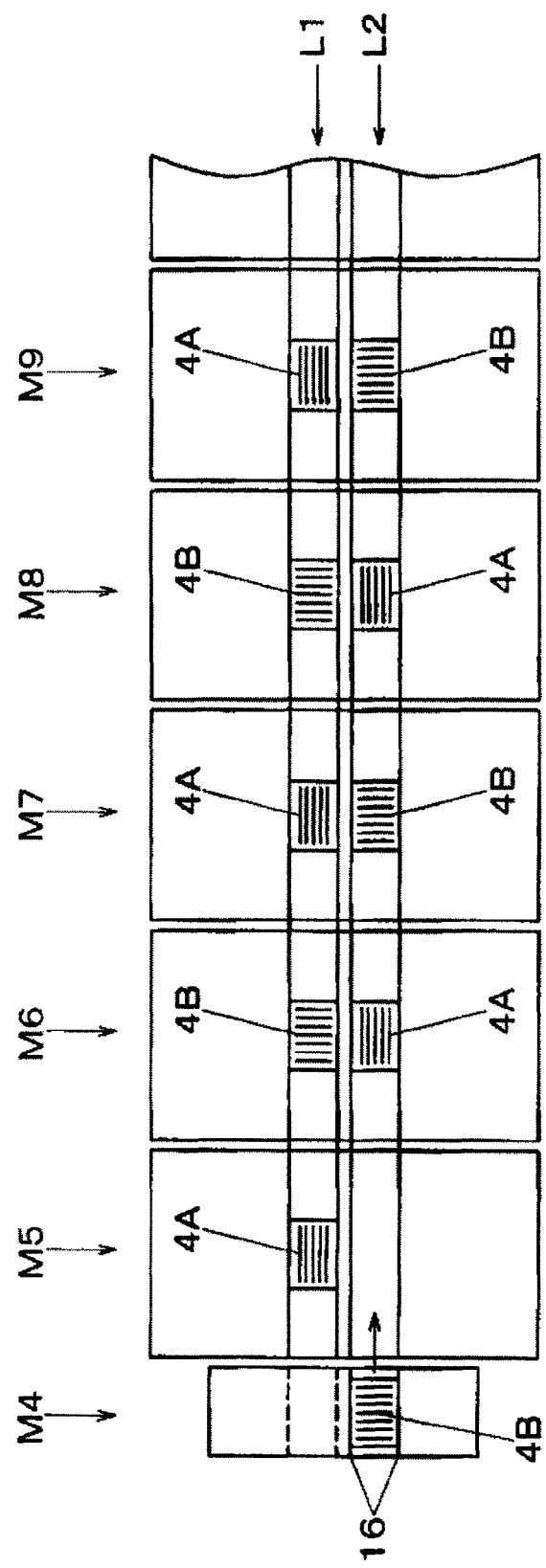
FIG. 5 is a view for explaining a board conveyance step in a component mounting method performed by the electronic component mounting system according to the embodiment of the invention.

FIG. 5 shows an actual operation example when the board 4A and 4B are distributed to a plurality of component mounting apparatuses, which are the component mounting apparatus M5 and following component mounting apparatuses, by the second distribution conveyor M4 in the electronic component mounting method performed by the electronic component mounting system 1 having the above-described configuration. The distribution operation is executed by the distribution control unit 31 controlling the second distribution conveyor M4 and the component mounting apparatus M5 based on a board request signal issued from the board request processing unit 34 of the component mounting apparatus M5.

FIG. 5 shows the case in which the state where the boards 4A and 4B are mixedly and alternately distributed to the first mounting lane L1 and the second mounting lane L2 of each of the component mounting apparatus M5 and the following apparatuses by the second distribution conveyor M4 is steadily continued. In the respective component mounting apparatuses M5 to M9, components are mounted on the boards 4 (4A and 4B) by the independent mounting method as described above. In this case, the same number of boards 4A and the same number of boards 4B are inputted to both the first mounting lane L1 and the second mounting lane L2. Accordingly, an average working tact time in each of the first mounting lane L1 and the second mounting lane L2 becomes an average value of the working tact times of the boards 4A and 4B. Accordingly, it is possible to keep line balance between the workload of the first mounting lane L1 and the workload of the second mounting lane L2 so that it is possible to make the apparatus operating state stable.

Incidentally, although not described in detail, it is a matter of course that electronic components to be mounted on the boards 4A and 4B are disposed in both the first component feeding units 17A and the second component feeding units 17B of the respective component mounting apparatuses M5 to M9.

Figure 6:
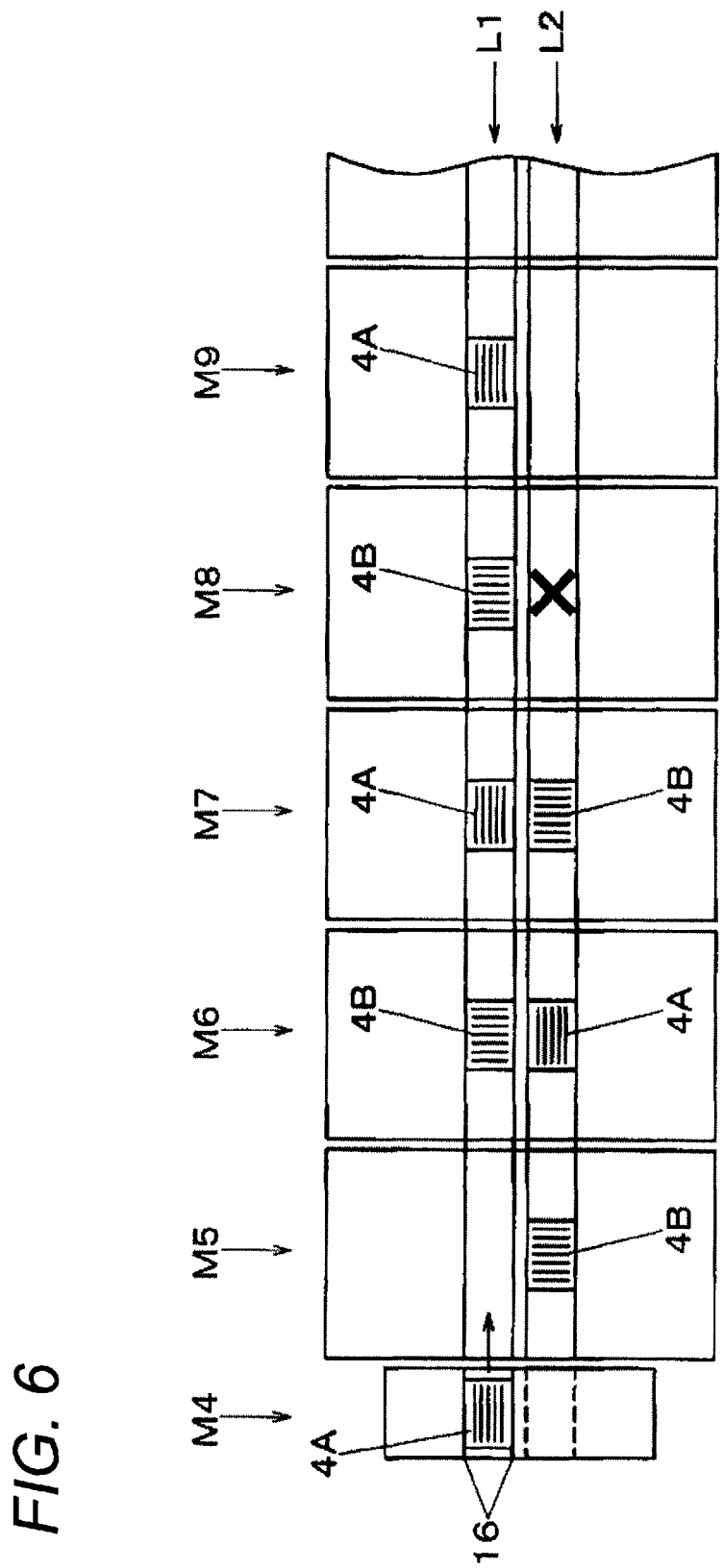
FIG. 6 is another view for explaining the board conveyance step in the component mounting method performed by the electronic component mounting system according to the embodiment of the invention.

FIG. 6 shows the case in which a trouble has occurred in one mounting lane of one apparatus (the second mounting lane L2 of the component mounting apparatus M8 in this case) in distribution of the boards 4A and 4B shown in FIG. 5 to the component mounting apparatus M5 and the following apparatuses, and the component mounting work in the mounting lane (the second mounting lane L2) of the one apparatus and the following apparatuses cannot be continued. In this case, the distribution control unit 31 limits the board distribution destination from the second distribution conveyor M4 to the first mounting lane L1 which is operating normally, and inputs the boards 4A and 4B without distinction to the first mounting lane L1. In this manner, although the number of produced boards is decreased, production of the board kinds in which the boards 4A and 4B are paired with each other can be prevented from being stopped. Thus, it is possible to minimize the influence of the apparatus trouble on the production plan.

As described above, in the electronic component mounting system and the electronic computer mounting method shown in the embodiment, provided is the component mounting line which is formed by interconnecting the component mounting apparatuses M5, M6, . . . each configured to include the first board conveyance mechanism 16A and the second board conveyance mechanism 16B having the board holding units which convey the two kinds of boards 4A and 4B delivered from an upstream-side apparatus in the board conveyance direction and which position and hold the conveyed boards 4A and 4B. In the component mounting line, the two kinds of boards 4A and 4B are mixedly distributed to each of the first board conveyance mechanism 16A and the second board conveyance mechanism 16B based on a board request signal issued from the component mounting apparatus M5 disposed as a most-upstream component mounting apparatus in the component mounting line. In this manner, it is possible to improve production efficiency of the two kinds of boards 4A and 4B different in mounting workload.

Incidentally, although the control function of the distribution control unit 31 is designed to belong to the management computer 3 according to the embodiment, configuration may be made so that a similar control function can be provided in the component mounting apparatus M5 disposed as a most-upstream component mounting apparatus in the component mounting line. In addition, in the case where a distribution conveyor is interposed between adjacent ones of the component mounting apparatuses in the component mounting line, the component mounting apparatus positioned immediately on the downstream side of the distribution conveyor is regarded as a component mounting apparatus disposed as a most-upstream component mounting apparatus similarly to the component mounting apparatus M5. Thus, in such a component mounting apparatus, the recognition marks MA and MB are recognized for identification of the board kinds.

The present application is based on a Japanese patent application (Patent Application No. 2013-032870) filed on Feb. 22, 2013, the contents of which are incorporated herein by reference.

There is an effect that the electronic component mounting system and the electronic component mounting method according to the invention can improve production efficiency of two kinds of boards different in mounting workload. Thus, the electronic component mounting system and the electronic component mounting method according to the invention are useful in the electronic component mounting field for mounting electronic components on boards to thereby manufacture mounted boards.

DESCRIPTION OF REFERENCE SIGNS

1: Electronic Component Mounting System
2: LAN System
3: Management Computer
4, 4A, 4B: Board
16A: First Board Conveyance Mechanism
16B: Second Board Conveyance Mechanism
17A: First Component Feeding Unit
17B: Second Component Feeding Unit
23A: First Component Mounting Mechanism
23B: Second Component Mounting Mechanism M1: Screen Printing Apparatus
M2: First Distribution Conveyor
M3: Printing Inspection Apparatus
M4: Second Distribution Conveyor
M5, M6: Component Mounting Apparatus
L1: First Mounting Lane
L2: Second Mounting Lane

The invention claimed is:

1. An electronic component mounting method performed by an electronic component mounting system that comprises:
   a screen printing apparatus including a first screen printing unit and a second screen printing unit to print solder paste on at least two kinds of boards including a first kind of boards and a second kind of boards, the first kind of boards and the second kind of boards having different component mounting densities,
   a printing inspection apparatus to execute predetermined printing inspection on the at least two kinds of boards, and
   a component mounting line formed by interconnecting a plurality of component mounting apparatuses concurrently performing component mounting work to mount an electronic component on the at least two kinds of boards,
   wherein the first screen printing unit comprises a first carrying conveyor which conveys the first kind of boards, and the second screen printing unit comprises a second carrying conveyor which conveys the second kind of boards,
   wherein the printing inspection apparatus comprises a single inspection conveyor which conveys the at least two kinds of boards, and an inspection head,
   wherein each of the component mounting apparatuses comprises:
      a first board conveyance mechanism and a second board conveyance mechanism, each of which comprises a board holding unit which conveys the board delivered from an upstream-side apparatus in a board conveyance direction and positions and holds the conveyed board;
      a component mounting unit which executes the component mounting work by picking up the electronic component fed by a component feeding unit and transfers and mounts the picked-up electronic component onto the board held by the board holding unit;
      a board distribution unit which receives the board from the upstream-side apparatus and distributes the received board to either the first board conveyance mechanism or the second board conveyance mechanism; and
   a distribution control unit which controls the first board conveyance mechanism, the second board conveyance mechanism and the board distribution unit,
   said electronic component mounting method comprising:
   exclusively conveying the first kind of boards to the first carrying conveyor, and exclusively conveying the second kind of boards to the second carrying conveyor,
   printing solder paste on the first kind of boards in the first screen printing unit, and printing solder paste on the second kind of boards in the second screen printing unit,
   conveying the first kind of boards from the first carrying conveyor to the single inspection conveyor, and conveying the second kind of boards from the second carrying conveyor to the single inspection conveyor,
   inspecting the first kind of boards and the second kind of boards with the inspection head, and
   conveying at least one of the first kind of boards and at least one of the second kind of boards from the single inspection conveyor to the first board conveyance mechanism and conveying at least another one of the first kind of boards and at least another one of the second kind of boards from the single inspection conveyor to the second board conveyance mechanism based on a board request signal issued from a most-upstream component mounting unit in the component mounting line,
   wherein said electronic component mounting method further comprises:
   imaging a recognition mark formed in each of the two kinds of the boards with a component recognition camera;
   recognizing the recognition mark based on a result of the imaging to thereby identify the kinds of the boards; and
   changing over first mounting data and second mounting data from one to the other based on an identification result of the board to thereby control the component mounting unit, the first mounting data and the second mounting data being stored in a storage unit and being provided for mounting the electronic component on the two kinds of the boards, respectively.

2. The electronic component mounting method according to claim 1,
   wherein the component feeding unit comprises a first component feeding unit and a second component feeding unit which are disposed on outer sides of the first board conveyance mechanism and the second board conveyance mechanism, respectively, and
   wherein the component mounting unit comprises a first component mounting mechanism and a second component mounting mechanism which are provided correspondingly to the first board conveyance mechanism and the second board conveyance mechanism, respectively,
   said electronic component mounting method comprising:
   causing the first component mounting mechanism to pick up the electronic component from the first component feeding unit, and mount the electronic component on the board positioned by the first board conveyance mechanism, and
   causing the second component mounting mechanism to pick up the electronic components from the second component feeding unit, and mount the electronic component on the board positioned by the second board conveyance mechanism.

3. The electronic component mounting method according to claim 1,
   wherein the at least one of the first kind of boards and the at least one of the second kind of boards are alternately conveyed to the first board conveyance mechanism, and the at least another one of the first kind of boards and the at least another one of the second kind of boards are alternately conveyed to the second board conveyance mechanism.

4. The electronic component mounting method according to claim 1,
   wherein the recognition mark includes a first recognition mark placed on a first surface of each of the at least two kinds of boards, and a second recognition mark placed on a second surface of each of the at least two kinds of boards opposite to the first surface.

\* \* \* \* \*